(12) United States Patent
Katayama

(10) Patent No.: US 9,824,736 B1
(45) Date of Patent: Nov. 21, 2017

(54) MEMORY DEVICE

(71) Applicant: TOSHIBA MEMORY CORPORATION, Minato-ku, Tokyo (JP)

(72) Inventor: Akira Katayama, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/457,468

(22) Filed: Mar. 13, 2017

Related U.S. Application Data

(60) Provisional application No. 62/385,912, filed on Sep. 9, 2016.

(51) Int. Cl.
*G11C 11/16* (2006.01)

(52) U.S. Cl.
CPC ...... *G11C 11/1673* (2013.01); *G11C 11/1695* (2013.01); *G11C 11/1697* (2013.01)

(58) Field of Classification Search
CPC ............ G11C 11/1673; G11C 11/1695; G11C 11/1697
See application file for complete search history.

(56) References Cited

U.S. PATENT DOCUMENTS

| | | | |
|---|---|---|---|
| 9,224,466 B1 | 12/2015 | Chen et al. | |
| 2006/0067149 A1 | 3/2006 | Shimizu et al. | |
| 2010/0321980 A1 | 12/2010 | Fujita et al. | |
| 2016/0379699 A1* | 12/2016 | Takahashi | G11C 11/1673 365/158 |

FOREIGN PATENT DOCUMENTS

| | | | | |
|---|---|---|---|---|
| JP | 2003338185 A | 11/2003 | | |
| JP | 2006099835 A | 4/2006 | | |
| JP | 2011003241 A | 1/2011 | | |
| KR | WO 2015136740 A1 * | 9/2015 | ......... | G11C 11/1673 |

* cited by examiner

*Primary Examiner* — Harry W Byrne
*Assistant Examiner* — R Lance Reidlinger
(74) *Attorney, Agent, or Firm* — Holtz, Holtz & Volek PC

(57) ABSTRACT

According to one embodiment, a memory device includes a memory cell array; a generation circuit generating a reference current; a sense amplifier comparing a cell current flowing through a memory cell with the reference current; a first clamp transistor connected between the sense amplifier and the memory cell; a second clamp transistor connected between the sense amplifier and the generation circuit; a first interconnect layer connected to a gate of the first clamp transistor; a second interconnect layer connected to a gate of the second clamp transistor and arranged adjacent to the first interconnect layer; and a first shield line arranged adjacent to one of the first interconnect layer and the second interconnect layer, a fixed voltage being applied to the first shield line.

15 Claims, 8 Drawing Sheets

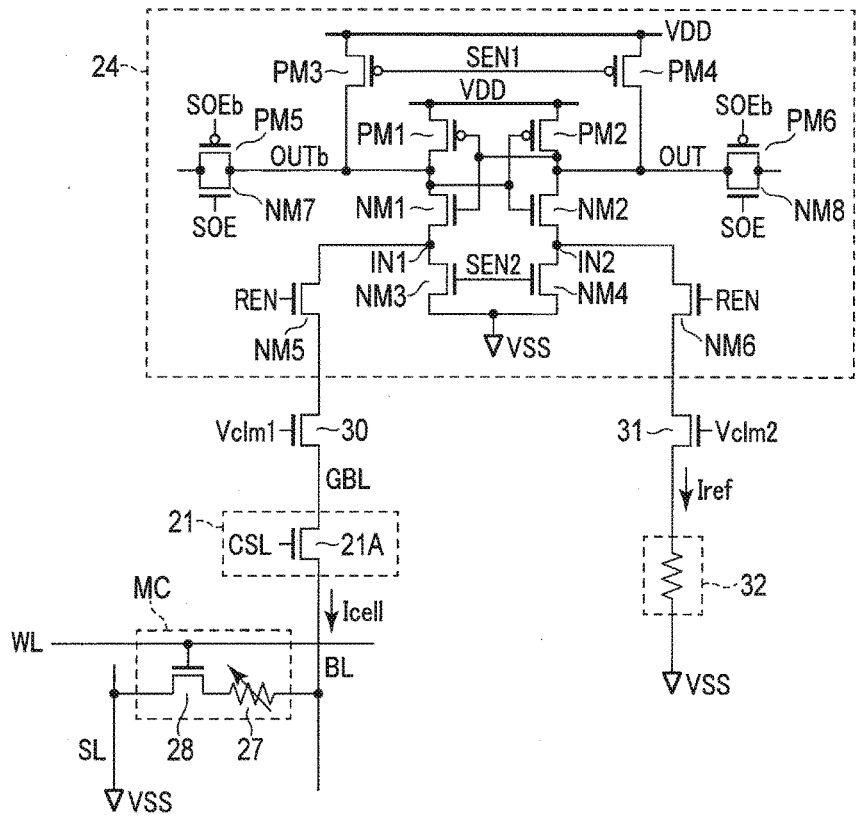
F I G. 6
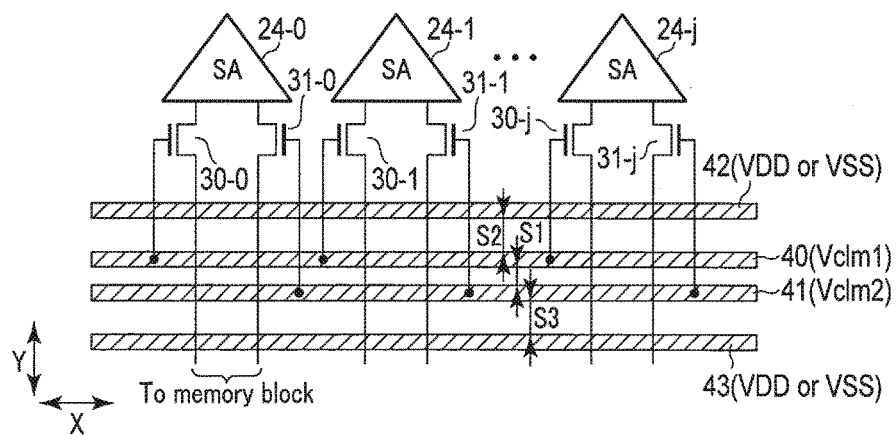
F I G. 7

MEMORY DEVICE

CROSS-REFERENCE TO RELATED APPLICATIONS

This application claims the benefit of U.S. Provisional Application No. 62/385,912, filed Sep. 9, 2016, the entire contents of which are incorporated herein by reference.

FIELD

Embodiments described herein relate generally to a memory device.

BACKGROUND

A resistance-change type memory is known as one type of a semiconductor memory device. A magnetoresistive random access memory (MRAM) is also known as one type of the resistance-change type memory. The MRAM is a memory device using magnetoresistive elements having a magnetoresistive effect in memory cells that store information. As a writing method of the MRAM, there is a spin-transfer torque writing method. Since this spin-transfer torque writing method has the property that the spin-transfer torque current for magnetization switching becomes smaller as a magnetic substance decreases in its size, it is advantageous to high degree of integration, low power consumption and high performance.

BRIEF DESCRIPTION OF THE DRAWINGS

FIG. 6 is a circuit diagram of a sense amplifier shown in FIG. 3;

FIG. 7 is a plan view illustrating an interconnect structure surrounding the sense amplifier according to the first embodiment;

DETAILED DESCRIPTION

In general, according to one embodiment, there is provided a memory device comprising:
a memory cell array including memory cells;
a generation circuit generating a reference current;
a sense amplifier comparing a cell current flowing through a memory cell with the reference current and sensing data stored in the memory cell;
a first clamp transistor connected between a first input terminal of the sense amplifier and the memory cell;
a second clamp transistor connected between a second input terminal of the sense amplifier and the generation circuit;
a first interconnect layer connected to a gate of the first clamp transistor and extending in a first direction;
a second interconnect layer connected to a gate of the second clamp transistor, extending in the first direction, and arranged adjacent to the first interconnect layer; and
a first shield line arranged adjacent to one of the first interconnect layer and the second interconnect layer and extending in the first direction, a fixed voltage being applied to the first shield line,
wherein a first interval between the first interconnect layer and the second interconnect layer is narrower than a second interval between the one of the first interconnect layer and the second interconnect layer and the first shield layer.

Embodiments will be described below with reference to the drawings. In the following description, the structural elements having the same function and configuration are denoted by the same sign and their descriptions will be repeated only when necessary. The drawings are schematic or conceptual, and the dimension, ratio, etc. in each of the drawings are not necessarily the same as the actual ones. Each embodiment exemplifies a device and a method for embodying the technical concept of the embodiment, and the technical concept does not limit the material, shape, structure, placement, etc. of the structural elements to the following matters.

In the following embodiments, a magnetoresistive random access memory (MRAM), which is one type of a resistance-change type memory, will be described as an example of a semiconductor memory device.

First Embodiment

[1] Configuration of Semiconductor Memory Device

Figure 1:
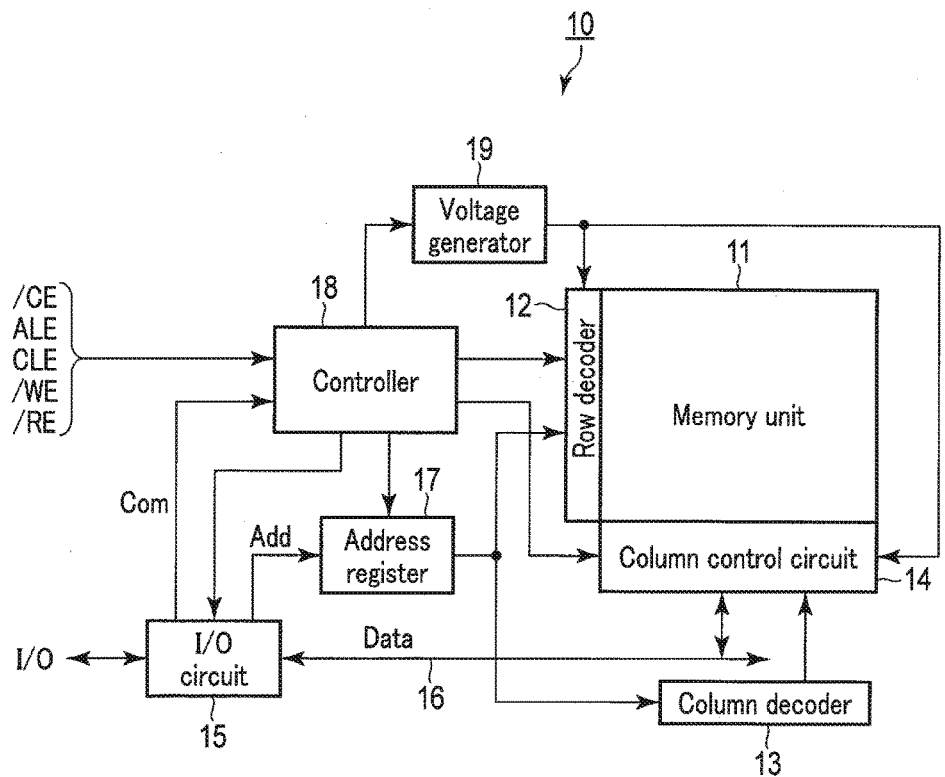
FIG. 1 is a block diagram of a semiconductor memory device according to a first embodiment.

FIG. 1 is a block diagram of a semiconductor memory device (MRAM) 10 according to a first embodiment. The semiconductor memory device 10 includes a memory unit 11, a row decoder 12, a column decoder 13, a column control circuit 14, an input/output circuit (I/O circuit) 15, an address register 17, a controller (main control circuit) 18 and a voltage generator 19.

The memory unit 11 includes a plurality of memory cells MC. Each of the memory cells MC includes a magnetic tunnel junction (MTJ) element as a storage element. The configuration of the memory cells MC will be specifically described later.

In the memory unit 11, a plurality of word lines WL are arranged to extend in the row direction, a plurality of bit lines BL are arranged to extend in the column direction that crosses the row direction, and a plurality of source lines SL are arranged to extend in the column direction. The memory cells MC are each connected to one word line WL, one bit line BL and one source line SL.

The row decoder 12 is connected to the word lines WL. The row decoder 12 receives a row address from the address register 17. The row decoder 12 decodes the row address and selects a word line WL on the basis of a decoded signal (row select signal). The row decoder 12 includes, for example, a driver (not shown) to drive a word line WL.

The column decoder 13 receives a column address from the address register 17. The column decoder 13 decodes the column address and sends a decoded signal (column select signal) to the column control circuit 14.

The column control circuit 14 is connected to the bit lines BL and the source lines SL. The column control circuit 14 reads data from a selected column, writes data thereto, and erases data therefrom. The column control circuit 14 includes a sense amplifier (read circuit), a write driver (write circuit) and the like. The configuration of the column control circuit 14 will be specifically described later.

The input/output circuit 15 is connected to an external device through an input/output terminal I/O. The input/output circuit 15 receives and transmits data from and to the external device. Between the input/output circuit 15 and the column control circuit 14, data is received and transmitted through a bus 16. The bus 16 is a bidirectional data bus.

The controller 18 controls the entire operation of the semiconductor memory device 10. The controller 18 receives various types of external control signals, such as a chip enable signal /CE, an address latch enable signal ALE, a command latch enable signal OLE, a write enable signal /WE and a read enable signal /RE, from an external device (a host controller, etc.). The sign "/" added to the signals represents an active low signal.

On the basis of these external control signals, the controller 18 distinguishes an address Add and a command Com which are supplied from the input/output terminal I/O. Then, the controller 18 transfers the address Add to the row decoder 12 and column decoder 13 through the address register 17. The controller 18 decodes the command Com. In response to the external control signals and command, the controller 18 performs sequence control to read data, write data and erase data.

The voltage generator 19 generates internal voltages (including, e.g. a voltage boosted higher than a power supply voltage) which are required for each operation. The voltage generator 19 is controlled by the controller 18 to generate required voltages.

[1-1] Configuration of Memory Unit 11

Figure 2:
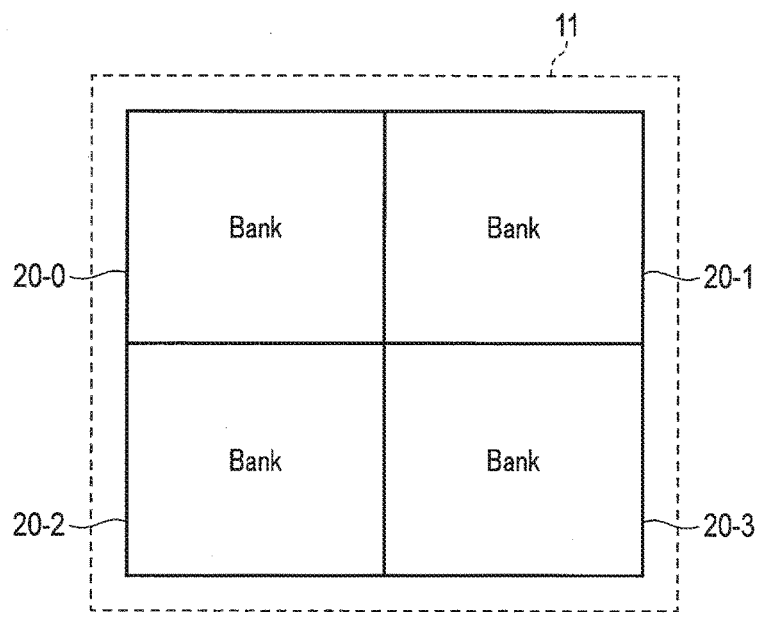
FIG. 2 is a block diagram of a memory unit shown in FIG. 1.

FIG. 2 is a block diagram showing one example of the memory unit. 11 shown in FIG. 1. In FIG. 2, four banks 20-0 to 20-3 are shown as one example. In the description of the present embodiment, the branch numbers of the banks 20-0 to 20-3 will be omitted unless the banks are particularly distinguished, and the description of a bank having no branch number is common to the banks 20-0 to 20-3. The same holds true of the other elements with branch numbers. In the present embodiment, data can be read, written and erased for each bank 20.

[1-2] Configuration of Column Control Circuit 14

Figure 3:
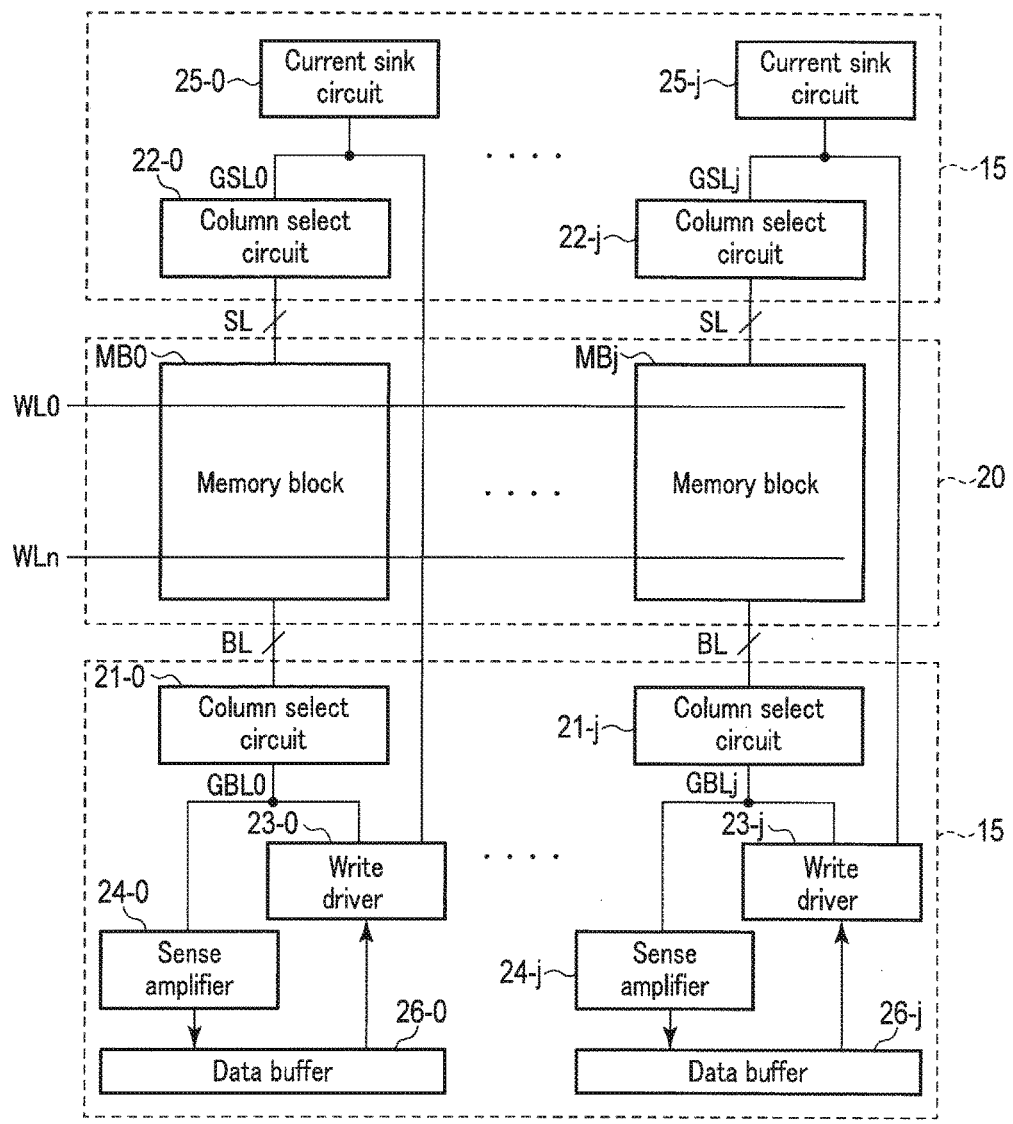
FIG. 3 is a bock diagram of a column control circuit shown in FIG. 1.

FIG. 3 is a bock diagram of the column control circuit 14 shown in FIG. 1. FIG. 3 shows an example of a hierarchical arrangement of the bit lines and source lines, and the correspondence among the memory cells, bit lines and source lines can arbitrarily be set.

The bank 20 includes a plurality of memory blocks MB0 to MBj. The letter "j" represents an integer of one or more. Each of the memory blocks MB0 to MBj includes a plurality of memory cells MC arranged in matrix. In the memory block MB, a plurality of word lines WL (WL0 to WLn), a plurality of bit lines EL and a plurality of source lines SL are arranged. The letter "n" represents an integer of one or more.

The column control circuit 14 includes column select circuits 21-0 to 21-$j$, column select circuits 22-0 to 22-$j$, write drivers 23-0 to 23-$j$, sense amplifiers 24-0 to 24-$j$, current sink circuits 25-0 to 25-$i$ and data buffers 26-0 to 26-$j$.

The column select circuit 21 is connected to the bit lines EL arranged in the memory block ME. The column select circuit 21 selects one bit line EL on the basis of a column select signal from the column decoder 13. The column select circuit 21 connects the selected bit line EL to a global bit line GEL.

The column select circuit 22 is connected to the source lines SL arranged in the memory block ME. The column select circuit 22 selects one bit source SL on the basis of a column select signal from the column decoder 13. The column select circuit 22 connects the selected source line SL to a global source line GSL.

The write driver 23 is connected to the global bit line GEL and the global source line GSL. In write operation, the write driver 23 writes data to a selected memory cell by causing current to flow through the selected memory cell.

The sense amplifier 24 is connected to the global bit line GEL, and the current sink circuit 25 is connected to the global source line GSL. In read operation, the current sink circuit 25 pulls current out of the global source line GSL. For example, the current sink circuit 25 applies a ground voltage VSS to the global source line GSL. In read operation, the sense amplifier 24 reads data from a selected memory cell by sensing current flowing through the selected memory cell.

In write operation, the data buffer 26 temporarily stores write data to be written to a memory cell. In read operation, the data buffer 26 temporarily stores read data read from a memory cell.

[1-3] Configuration of Memory Block MB

Figure 4:
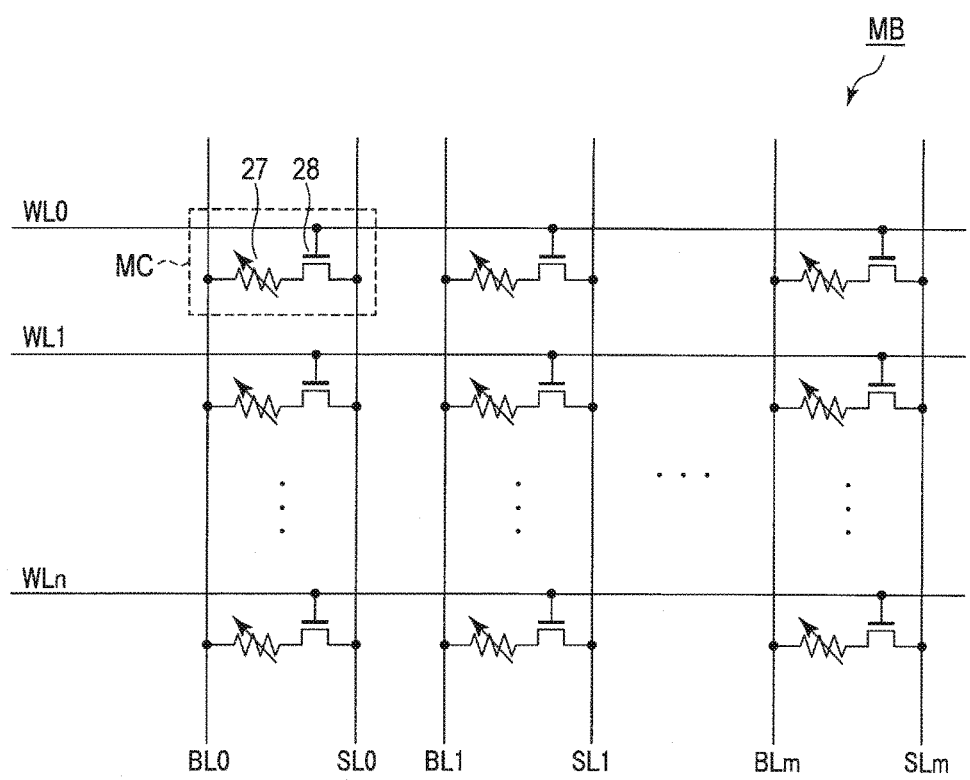
FIG. 4 is a circuit diagram of a memory block shown in FIG. 3.

FIG. 4 is a circuit diagram of the memory block shown in FIG. 3.

In the memory block MB, a plurality of word lines WL (WL0 to WLn) are arranged to extend in the row direction, a plurality of bit lines BL (BL0 to BLm) are arranged to extend in the column direction that crosses the row direction, and a plurality of source lines SL (SL0 to SLm) are arranged to extend in the column direction. The letter an integer of one or more. The bit lines EL and the source lines SL are arranged alternately.

The memory cell MC includes a magnetic tunnel junction (MTJ) element 27 serving as a storage element, and a cell transistor (select transistor) 28. The MTJ element 27 is a magnetoresistive element (magnetoresistive effect element) capable of storing data according to a variation in resistive state and rewriting data by current, for example. The cell transistor 28 includes, e.g. an n-channel metal oxide semiconductor (MOS) transistor.

One end of the MTJ element 27 is connected to the bit line EL and the other end thereof is connected to the drain of the cell transistor 28. The gate of the cell transistor 28 is connected to the word line WL and the source thereof is connected to the source line SL.

[1-4] Configuration of MTJ Element 27

Figure 5:
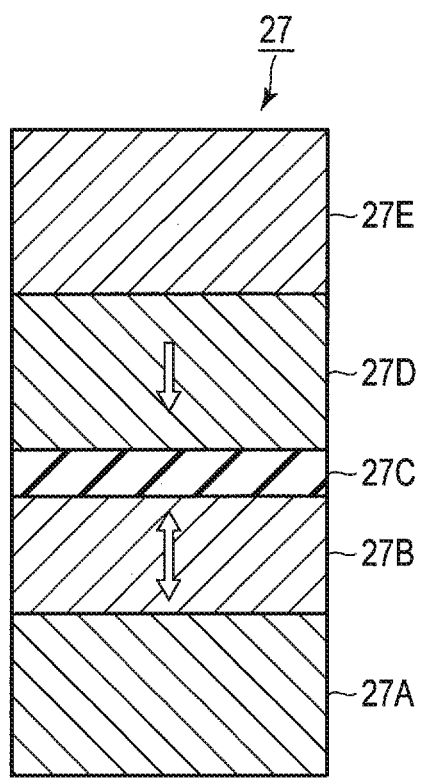
FIG. 5 is a cross-sectional view of an MTJ element shown in FIG. 4.

One example of the configuration of the MTJ element 27 will be described below. FIG. 5 is a cross-sectional view of the MTJ element 27 shown in FIG. 4.

The MTJ element 27 is configured by laminating a lower electrode 27A, a memory layer (free layer) 275, a nonmagnetic layer (tunnel barrier layer) 27C, a reference layer (fixed layer) 275 and an upper electrode 27E in sequence. For example, the lower electrode 27A is electrically connected to the cell transistor 28, and the upper electrode 273 is electrically connected to the bit line BL. Incidentally, the order of lamination of the memory layer 272 and reference layer 275 can be reversed.

The memory layer 272 and the reference layer 275 are each made of a ferromagnetic material. The tunnel barrier layer 27C is made of, for example, an insulation material such as MgO.

The memory layer 272 and the reference layer 27D each have, for example, perpendicular magnetic anisotropy and their easy-magnetization direction is perpendicular. The perpendicular magnetic anisotropy represents that the magnetization direction is perpendicular or almost perpendicular to the film surface (the upper surface or lower surface). The "almost perpendicular" includes the fact that the direction of remanent magnetization falls within the range of 45°<θ≤90° with respect to the film surface. Incidentally, the magnetization direction of the memory layer 273 and reference layer 27D may be equal to the in-plane direction.

The magnetization direction of the memory layer 273 is variable (inverted), which means that the magnetization direction of the memory layer 273 can be varied when a predetermined write current is caused to flow through the MTJ element 27. The magnetization direction of the reference layer 270 is invariable (fixed), which means that the magnetization direction of the reference layer 270 is not varied when the predetermined write current is caused to flow through the MTJ element 27.

The reference layer 270 is set to have perpendicular magnetic anisotropy energy (or coercive force) which is much higher than that of the memory layer 273. The magnetic anisotropy can be set by adjusting the material, area and thickness of a magnetic layer. The magnetization switching current of the memory layer 273 is made small, and the magnetization switching current of the reference layer 270 is made larger than that of the memory layer 273. It is thus possible to achieve the MTJ element 27 including the memory layer 273 whose magnetization direction is variable when a predetermined write current is caused to flow and the reference layer 270 whose magnetization direction is invariable when a predetermined write current is caused to flow.

In the present embodiment, a spin-transfer torque writing method is used in which a write current is caused to flow directly through the MTJ element 27 to control the magnetization state of the MTJ element 27. The MTJ element 27 can be set in a low-resistance state or a high-resistance state depending on whether the relative relation of magnetization between the memory layer 27B and the reference layer 27D is parallel or antiparallel. In other words, the MTJ element 27 is a variable resistive element.

If a write current from the memory layer 27B to the reference layer 27D is caused to flow through the MTJ element 27, the relative relation of magnetization between the memory layer 27B and the reference layer 270 becomes parallel. In this parallel state, the resistance value of the MTJ element 27 becomes the lowest, and the MTJ element 27 is set in a low-resistance state. The low-resistance state of the MTJ element 27 is defined as, for example, data "0."

On the other hand, if a write current from the reference layer 27D to the memory layer 27B is caused to flow through the MTJ element 27, the relative relation of magnetization between the memory layer 27B and the reference layer 270 becomes antiparallel. In this antiparallel state, the resistance value of the MTJ element 27 becomes the highest, and the MTJ element 27 is set in a high-resistance state. The high-resistance state of the MTJ element 27 is defined as, for example, data "1."

Thus, the MTJ element 27 can be used as a storage element capable of storing one-bit data (binary data). The resistance state of the MTJ element 27 and the assignment of the data can arbitrarily be set.

When data is read from the MTJ element 27, a read voltage is applied to the MTJ element 27 to sense a resistance value of the MTJ element 27 on the basis of a read current flowing through the MTJ element 27. This read current is set to a value that is much smaller than a threshold at which magnetization switching occurs by spin-transfer torque.

[1-5] Configuration of Sense Amplifier 24

FIG. 6 is a circuit diagram of the sense amplifier 24 shown in FIG. 3. FIG. 6 shows an example of the configuration of a current sensing type sense amplifier, but the sense amplifier 24 is not limited to the current sensing type, and a voltage sensing type sense amplifier can be used. The sense amplifier 24 includes P-channel MOS transistors PM1 to PM6 and N-channel MOS transistors NM1 to NM8. The controller 18 supplies a signal to control the sense amplifier 24.

The transistor PM1 and transistor NM1 compose an inverter circuit. The source of the transistor PM1 is connected to a power supply terminal VDD, the drain thereof is connected to a node OUTb and the gate thereof is connected to a node OUT. The drain of the transistor NM1 is connected to the node OUTb, the source thereof is connected to a node IN1 and the gate thereof is connected to the node OUT.

The transistor PM2 and transistor NM2 compose an inverter circuit. The source of the transistor PM2 is connected to the power supply terminal VDD, the drain thereof is connected to the node OUT and the gate thereof is connected to the node OUTb. The drain of the transistor NM2 is connected to the node OUT, the source thereof is connected to a node IN2 and the gate thereof is connected to the node OUTb.

The drain of the transistor NM3 is connected to the node IN1, the source thereof is connected to a ground terminal VSS and the gate thereof is supplied with a signal SEN2. The drain of the transistor NM4 is connected to the node IN2, the source thereof is connected to the ground terminal VSS and the gate thereof is supplied with the signal SEN2.

The source of the transistor PM3 is connected to power supply terminal VDD, the drain thereof is connected to the node OUTb and the gate thereof is supplied with a signal SEN1. The source of the transistor PM4 is connected to the power supply terminal VDD, the drain thereof is connected to the node OUT and the gate thereof is supplied With the signal SEN1.

The transistors PM5 and NM7 compose a transfer gate. The first terminal of the transistors PM5 and NM7 is connected to the node OUTb and the second terminal thereof is connected to the data buffer 26. The gate of the transistor PM5 is supplied with a signal SOEb. The gate of the transistor NM7 is supplied with a signal SOE. The signal SOEb is an inverted signal of the signal SOE. The transfer gate composed by the transistors PM5 and NM7 transfers data of the node OUTb to the data buffer 26 when the signal SOE is asserted as a high level.

The transistors PM6 and NM8 compose a transfer gate. The first terminal of the transistors PM6 and NM8 is connected to the node OUT and the second terminal thereof is connected to the data buffer 26. The gate of the transistor PM6 is supplied with a signal SOEb. The gate of the transistor NM8 is supplied with a signal SOE. The transfer gate composed by the transistors PM6 and NM8 transfers data of the node OUT to the data buffer 26 when the signal. SOS is asserted as a high level.

The drain of the transistor NM5 is connected to the node IN1, the source thereof is connected to the drain of a clamp transistor 30 and the gate thereof is supplied with a signal REN. The drain of the transistor NM6 is connected to the node IN2, the source thereof is connected to the drain of a clamp transistor 31 and the gate thereof is supplied with a signal REN.

The clamp transistor 30 has a function of making a cell current Icell flowing through the global bit line GEL almost constant and has a function of preventing the cell current Icell from exceeding a limiting current. The clamp transistor 30 is formed of, for example, an N-channel MOS transistor. A voltage Vclm1 is applied to the gate of the clamp transistor 30, and the source of the clamp transistor 30 is connected to the global bit line GBL.

The global bit line GEL is connected to the bit line EL through a column select transistor 21A included in the column select circuit 21. The gate of the column select transistor 21A is supplied with a column select signal CSL from the column decoder 13.

The clamp transistor 31 has a function of making a reference current Iref flowing to a reference current generator 32 almost constant and has a function of preventing the reference current Iref from exceeding the limiting current. The clamp transistor 31 is formed of, for example, an N-channel MOS transistor. A voltage Vclm2 is applied to the gate of the clamp transistor 31, and the source of the clamp transistor 31 is connected to the reference current generator 32.

The reference current generator 32 generates a reference current Iref. The reference current generator 32 includes, for example, a fixed resistance element. The reference current Iref is used to determine data stored in the memory cell MC. The fixed resistance element included in the reference current generator 32 has a resistance value between the high-resistance state and low-resistance state of the MTJ element 27. Thus, the reference current Iref is set between a cell current caused to flow by the MTJ element in the high-resistance state and a cell current caused to flow by the MTJ element in the low-resistance state. One end of the reference current generator 32 is connected to the ground terminal VSS.

[2] Interconnect Structure

An interconnect structure surrounding the sense amplifier 24 will be described below. FIG. 7 is a plan view illustrating an interconnect structure surrounding the sense amplifier 24.

Clamp transistors 30-0 to 30-j for cell current are connected to the first input terminals of the sense amplifiers 24-0 to 24-j, respectively. Clamp transistors 31-0 to 31-j for reference current are connected to the second input terminals of the sense amplifiers 24-0 to 24-j, respectively.

The gates of the clamp transistors 30-0 to 30-j are electrically connected in common to an interconnect layer 40 extending in the X direction. The voltage generator 19 applies a clamp voltage Vclm1 to the interconnect layer 40. The interconnect layer 40 is used to apply the clamp voltage Vclm1 to the clamp transistors 30-0 to 30-j. The gates of the clamp transistors 31-0 to 31-j are electrically connected in common to an interconnect layer 41 extending in the X direction. The voltage generator 19 applies a clamp voltage Vclm2 to the interconnect layer 41. The interconnect layer 41 is used to apply the clamp voltage Vclm2 to the clamp transistors 31-0 to 31-j. In other words, the present embodiment has an interconnect structure in which the clamp voltage Vclm1 for cell current and the clamp voltage Vclm2 for reference current can be controlled individually. The interconnect layer 41 is formed adjacent to the interconnect layer 40 in the Y direction orthogonal to the X direction.

Shield interconnect layers 42 and 43 extend in the X direction and are arranged to interpose the interconnect layers 40 and 41 therebetween. The shield interconnect layers 42 and 43 have a function of suppressing noise occurring on the interconnect layers 40 and 41. This noise includes noise due to the capacitive coupling of adjacent two interconnects, in which a voltage variation of one of the interconnects causes a voltage variation of the other interconnect.

The interconnect layers 40 and 41 and shield interconnect layers 42 and 43 are formed of, e.g. interconnect layers of the same level. The interconnect layers 40 and 41 and shield interconnect layers 42 and 43 are insulated by insulation layers in the Y direction with each other. The clamp transistors 30 and 31 are formed on a semiconductor substrate. On the semiconductor substrate, a plurality of interconnect layers corresponding to a plurality of levels are provided. The interconnect layers 40 and 41 and shield interconnect layers 42 and 43 are provided in one of the interconnect layers of a plurality of levels.

The voltage generator 19 applies a power supply voltage VDD or a ground voltage VSS to the shield interconnect layers 42 and 43. Thus, noise occurring on the interconnect layer 40 can be suppressed because there is almost no voltage variation in the shield interconnect layer 42 adjacent to the interconnect layer 40. Similarly, noise occurring on the interconnect layer 41 can be suppressed because there is almost no voltage variation in the shield interconnect layer 43 adjacent to the interconnect layer 41.

Here, an interval between the interconnect layers 40 and 41 is expressed by S1, an interval between the interconnect layer 40 and the shield interconnect layer 42 is expressed by S2, and an interval between the interconnect layer 41 and the shield interconnect layer 43 is expressed by S3. The relationship between the intervals S1 and S2 is expressed by "S1<S2." The relationship between the intervals S1 and S3 is expressed by "S1<S3." In other words, in the present embodiment, the interconnect layers 40 and 41 are interposed between the shield interconnect layers 42 and 43, and the interval S1 between the interconnect layers 40 and 41 is set smaller as expressed by "S1<S2" and "S1<S3."

[3] Operation

An operation of the semiconductor memory device 10 configured as described above will be described below.

[3-1] Operation of Clamp Transistors 30 and 31

First, an operating mode of the semiconductor memory device 10 will be described. The semiconductor memory device 10 can be operated in a test mode and a normal mode. The test mode is a mode of testing characteristics of the semiconductor memory device 10. The normal mode is a mode of data storage that is a function intrinsic to the semiconductor memory device 10, and includes a write operation, a read operation and an erase operation. For example, the test mode is used by a manufacturer before the shipment of the semiconductor memory device 10, and the normal mode is used by a user after the shipment of the semiconductor memory device 10.

In the test mode, the characteristics of the sense amplifier 24 are tested and evaluated. In the test mode, the clamp voltage Velm1 for cell current is a fixed voltage that is predetermined in accordance with the characteristics of the memory cell MC. In accordance with the level of the clamp voltage Velm1, cell current Icell flowing through the memory cell MC at the time of reading is determined.

In the test mode, furthermore, the clamp voltage Vclm2 for reference current is varied (or swept) within a given voltage range. The clamp voltage Vclm2 is varied using, e.g. a tester. If the clamp voltage Vclm2 is varied, the reference current can be varied.

If the clamp voltage Vclm2 is varied while causing a cell current to flow through the global bit line GBL, a sensing operation of the sense amplifier 24 can be evaluated. More specifically, the sense amplifier 24 can evaluate a threshold value to determine data "0" and data "1." This test can be achieved by forming the interconnect layer 40 for clamp voltage Vclm1 and the interconnect layer 41 for clamp voltage Vclm2 separately from each other, as described in the present embodiment.

In the normal mode, the clamp voltage Vclm2 is set in the same manner as the clamp voltage Vclm1.

In the present embodiment, the interconnect layer 40 for clamp voltage Vclm1 and the interconnect layer 41 for clamp voltage Vclm2 are arranged adjacent to each other, and the interval S1 between the interconnect layers 40 and 41 is set smaller.

If noise occurs on the interconnect layer 40, noise of the same phase occurs on the interconnect layer 41 by the capacitive coupling between the interconnect layers 40 and 41. In other words, a voltage variation (or a voltage bounce) between the interconnect layers 40 and 41 occurs in the same direction. Since the noise of the same phase does not have any influence on a difference in voltage between the interconnect layers 40 and 41, a read margin can be prevented from lowering in the sense amplifier 24 to sense a difference in voltage between two input terminals. If noise occurs on the interconnect layer 41, a read margin can be prevented from lowering likewise. Incidentally, the read margin means a margin in which the sense amplifier 24 can read data correctly even though a voltage variation (or a voltage bounce) occurs in a plurality of interconnects regarding the sensing operation of the sense amplifier 24

[3-2] Operation of Sense Amplifier 24

Figure 8:
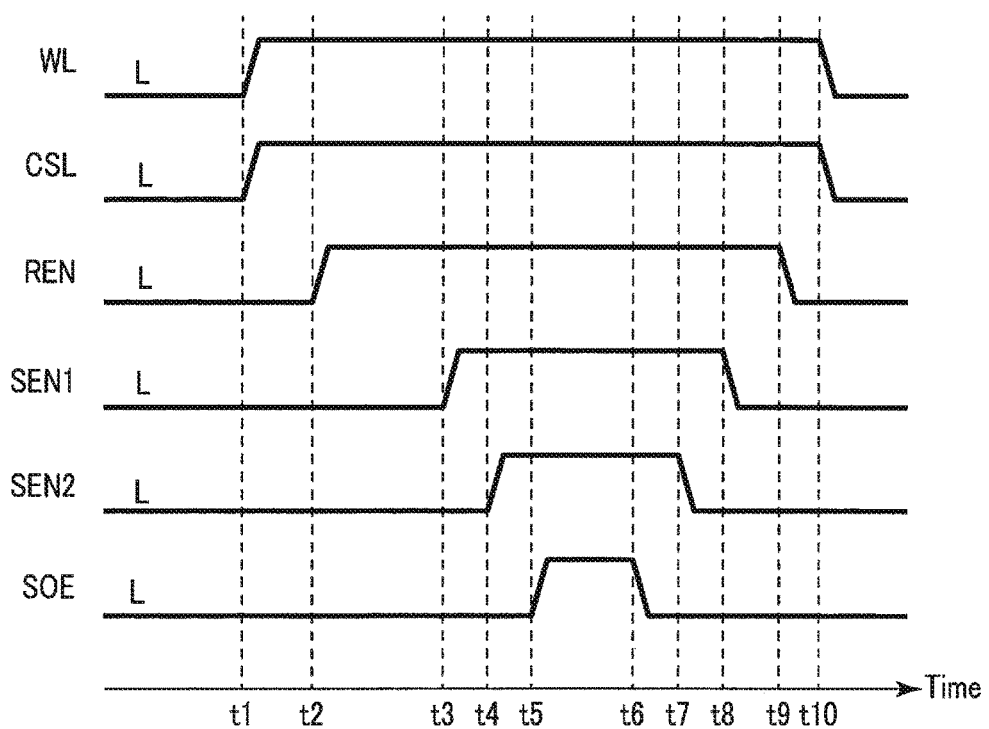
FIG. 8 is a timing chart illustrating an operation of the sense amplifier.

An operation of the sense amplifier 24 will be described below. FIG. 8 is a timing chart illustrating an operation of the sense amplifier 24.

At time t1, the word line WL and the column select signal CSL are rendered at a high level. According, the cell transistor 28 of the memory cell MC and the column select transistor 21A are turned on.

At time t2, the signal REN is rendered at a high level, and the transistors NM5 and NM6 are turned on. Accordingly, the sense amplifier 24 is connected to the global bit line GBL and the reference current generator 32.

At time t3, the signal SEN1 is rendered at a high level, and the transistors PM3 and PM4 are turned off. Accordingly, the charges of the node IN1 are pulled out by the memory cell MC. The charges of the node IN2 are also pulled out by the reference current generator 32.

When the memory cell MC stores data "0," the MTJ element 27 is rendered in a low-resistance state and the cell current Icell becomes larger than the reference current Iref. Accordingly, the transistor PM2 is turned on and the node OUT is rendered at a high level. When the memory cell MC stores data "1," the MTJ element 27 is rendered in a high-resistance state and the cell current Icell becomes smaller than the reference current Iref. Accordingly, the transistor PM1 is turned on and the node OUTb is rendered at a high level.

At time t4, the signal SEN2 is rendered at a high level, the transistors NM3 and NM4 are turned on. Accordingly, data of a latch circuit formed of two inverter circuits (transistors PM1, NM1, PM2 and NM2) included in the sense amplifier 24 is determined.

At time t5, the signal SOE is set at a high level, and two transfer gates (transistors PM5, NM7, PM6 and NM8) are turned on. Accordingly, data of the nodes OUTb and OUT is transferred to the data buffer 26.

After that, the sense amplifier 24 is set in a precharge state prior to reading. In other words, at each of times t6 to t9, the signals SOE, SEN2, SEN1 and REN are rendered at a low level. At time t10, the word line WL and the column select signal CSL are rendered at a low level.

[4] Advantages of First Embodiment

As described in detail above, in the first embodiment, the semiconductor memory device 10 includes the sense amplifier 24 which senses data stored in the memory cell MC, the clamp transistor 30 connected between the first input terminal of the sense amplifier 24 and the memory cell MC, and the clamp transistor 31 connected between the second input terminal of the sense amplifier 24 and the reference current generator 32. The semiconductor memory device 10 also includes an interconnect layer 40 connected to the gate of the clamp transistor 30 and extending in the X direction to apply a clamp voltage Vclm1, an interconnect layer 41 connected to the gate of the clamp transistor 31 and formed adjacent to the interconnect layer 40 to apply a clamp voltage Vclm2, and a shield interconnect layer 42 which is formed adjacent to the interconnect layer 40 and to which a fixed voltage (power supply voltage VDD or ground voltage VSS) is applied. The interval S1 between the interconnect layers 40 and 41 is set smaller than the interval S2 between the interconnect layer 41 and the shield interconnect layer 42.

According to the first embodiment, therefore, the interval between the interconnect layers 40 and 41 can be narrowed; thus, when noise occurs on one of the interconnect layers 40 and 41, noise of the same phase also occurs on the other interconnect layer by capacitive coupling between the interconnect layers 40 and 41. Therefore, the read margin of the sense amplifier 24 can be inhibited from lowering.

In the worst case in particular, an antiphase voltage variation is caused on the interconnect layers 40 and 41, and it is possible that the sense amplifier 24 cannot read data correctly. In the present embodiment, however, the worst case can be prevented.

Since, furthermore, the shield interconnect layer 42 is provided adjacent to the interconnect layer 40, noise can be inhibited from being applied from the other side of the shield interconnect layer 42 from the interconnect layer 40. The read margin can thus be inhibited from lowering. If the shield interconnect layer 43 is added adjacent to the interconnect layer 41, noise occurring on the interconnect layers 40 and 41 can be further suppressed.

Second Embodiment

According to the second embodiment, an interconnect layer 40 for clamp voltage Vclm1 and an interconnect layer 41 for clamp voltage Vclm2 are set at the same voltage by short-circuiting the interconnect layers 40 and 41 in a normal mode.

Figure 9:
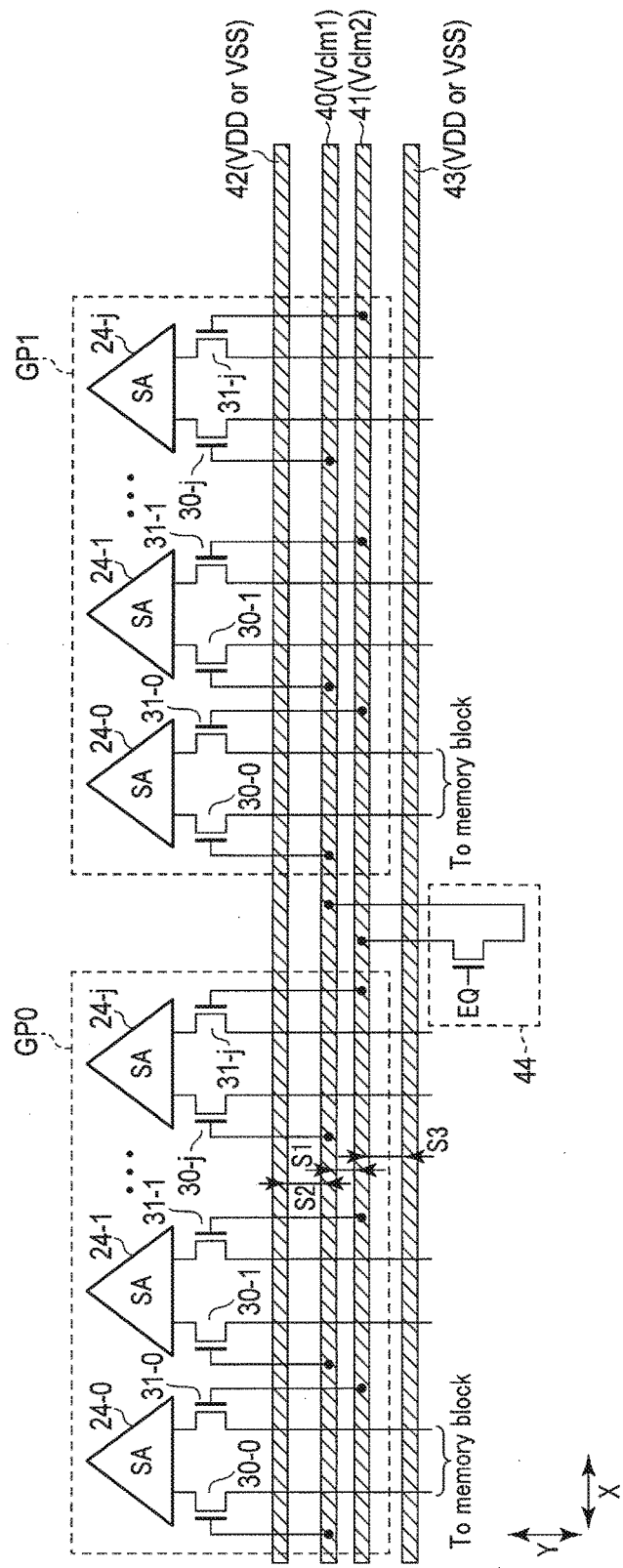
FIG. 9 is a plan view illustrating an interconnect structure surrounding a sense amplifier according to a second embodiment.

FIG. 9 is a plan view illustrating an interconnect structure surrounding a sense amplifier 24 according to the second embodiment.

The semiconductor memory device 10 includes a plurality of sense amplifiers 24, and the sense amplifiers 24 are divided into groups GP0 and GP1. Each of the groups GP0 and GP1 includes sense amplifiers 24-0 to 24-j. For example, the group GP0 is provided to correspond to one bank 20 and the group GP1 is provided to correspond to another bank 20. The groups GP0 and GP1 of the sense amplifiers 24 need not particularly correspond to the bank 20, but a plurality of sense amplifiers connected to a certain memory cell array in the memory unit 11 can be divided into a plurality of groups. The correspondence between the groups GP0 and GP1 of the sense amplifiers and the memory cell array can arbitrarily set.

The semiconductor memory device 10 also includes an equalizing circuit 44. The equalizing circuit 44 is formed of, e.g. an N-channel MOS transistor. One end of the transistor 44 is electrically connected to the interconnect layer 40 for clamp voltage Vclm1, the other end thereof is electrically connected to the interconnect layer 41 for clamp voltage Vclm2, and the gate thereof is supplied with a signal EQ from the controller 18. The level of the signal EQ becomes high in the normal mode and low in the test mode.

The equalizing circuit 44 is placed between the groups GP0 and GP1 of the sense amplifiers 24. For example, the equalizing circuit 44 is placed in a region where the arrangement continuity of the sense amplifiers 24 is broken. The equalizing circuit 44 can be placed at the other end portion of the group GP1 from the group GP0 or at the other end portion of the group GP0 from the group GP1. The number of transistors composing the equalizing circuit 44 is not limited to one, but a plurality of transistors can be provided. The positions of the transistors composing the equalizing circuit 44 can arbitrarily be set.

In the test mode, the signal EQ is rendered at a low level and the transistor 44 is turned off. Accordingly, the voltage (clamp voltage Vclm1) of the interconnect layer 40 and the voltage (clamp voltage Vclm2) of the interconnect layer 41 can be controlled individually.

In the normal mode, the signal EQ is rendered at a high level and the transistor 44 is turned on. Accordingly, the interconnect layers 40 and 41 are short-circuited and can be set at the same voltage. As a result, the voltages of the interconnect layers 40 and 41 vary in the same direction and thus a read margin can be prevented from lowering.

Third Embodiment

In a third embodiment, after the test mode is completed, an interconnect layer for short-circuiting the interconnect layer 40 for clamp voltage Vclm1 and the interconnect layer 41 for clamp voltage Vclm2 physically and electrically is formed.

Figure 10:
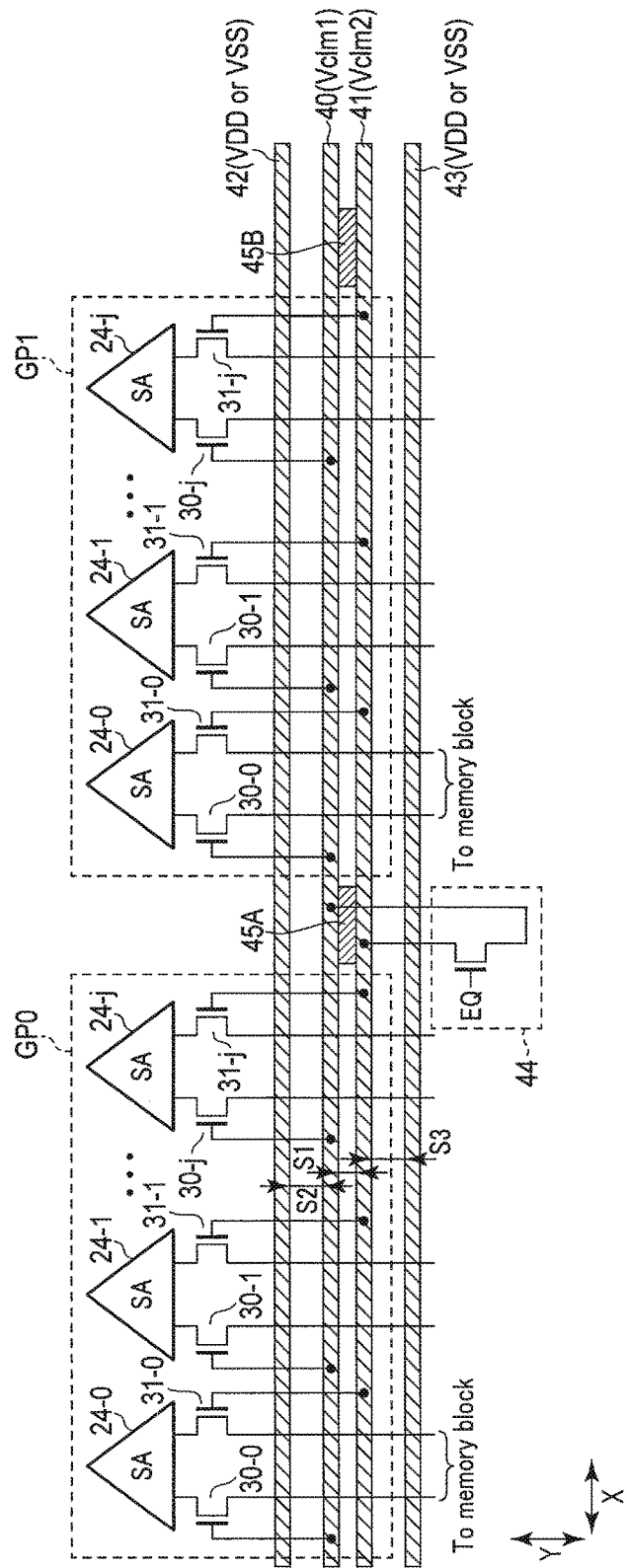
FIG. 10 is a plan view illustrating an interconnect structure surrounding a sense amplifier according to a third embodiment.

FIG. 10 is a plan view illustrating an interconnect structure surrounding a sense amplifier 24 according to the third embodiment.

The interconnect layers 40 and 41 are electrically connected by interconnect layers 45A and 45B. The interconnect layers 45A and 453 are formed of, e.g. a metal layer.

The positions of the interconnect layers 45A and 45B can arbitrarily be set. In the example of FIG. 10, the interconnect layer 45A is placed between the groups GP0 and GP1 and the interconnect layer 453 is placed at an end portion of the group GP1. The number of interconnect layers 45A and 453 may be one, or three or more. The interconnect layers 45A and 453 are placed in a region where the arrangement continuity of the sense amplifiers 24 is broken.

The interconnect layers 45A and 453 are formed after the test mode is completed. Thus, the voltages of the interconnect layers 40 and 41 can be controlled individually before the interconnect layers 45A and 453 are formed.

For example, the interconnect layers 40 and 41 are formed of an interconnect layer of the highest level. It is therefore possible to facilitate a step of forming the interconnect layers 45A and 453 after test is completed.

Like in the second embodiment, in the third embodiment, the interconnect layers 40 and 41 can be short-circuited and set at the same voltage in the normal mode. Unlike in the second embodiment, in the third embodiment, no control signal for short-circuiting the interconnect layers 40 and 41 is required.

Incidentally, the MRAM of each of the foregoing embodiments can be replaced with a spin-transfer torque magnetoresistive random access memory (STT-MRAM) using a spin-transfer torque phenomenon for magnetization switching of magnetic layers.

The foregoing embodiments each have been described by taking, as an example, an MRAM storing data using a magnetoresistive effect element (MTJ element) as a variable resistive element; however, they are not limited to the MRAM. For example, they can be applied to a semiconductor memory device including an element storing data using a change in resistance, such as a resistance-change type memory similar to the MRAM, such as a resistive random access memory (ReRAM) and a phase-change random access memory (PCRAM). They can also be applied to a semiconductor memory device including an element capable of storing data with a change in resistance caused by the supply of current or application of voltage or reading the stored data by converting a difference in resistance due to the change in resistance into a difference in current or voltage, even though the semiconductor memory device may be a volatile memory and a nonvolatile memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a memory cell array including memory cells;
a generation circuit generating a reference current;
a sense amplifier comparing a cell current flowing through a memory cell with the reference current and sensing data stored in the memory cell;
a first clamp transistor connected between a first input terminal of the sense amplifier and the memory cell;
a second clamp transistor connected between a second input terminal of the sense amplifier and the generation circuit;
a first interconnect layer connected to a gate of the first clamp transistor and extending in a first direction;
a second interconnect layer connected to a gate of the second clamp transistor, extending in the first direction, and arranged adjacent to the first interconnect layer; and
a first shield line arranged adjacent to one of the first interconnect layer and the second interconnect layer and extending in the first direction, a fixed voltage being applied to the first shield line,
wherein a first interval between the first interconnect layer and the second interconnect layer is narrower than a second interval between the one of the first interconnect layer and the second interconnect layer and the first shield layer.

2. The device of claim 1, further comprising a second shield line arranged adjacent to the other of the first interconnect layer and the second interconnect layer and extending in the first direction, a fixed voltage being applied to the second shield line,
  wherein the first interval is narrower than a third interval between the other of the first interconnect layer and the second interconnect layer and the second shield layer.

3. The device of claim 1, further comprising:
sense amplifiers including the sense amplifier and provided to correspond to the memory cells;
first clamp transistors including the first clamp transistor and connected to the sense amplifiers; and
second clamp transistors including the second clamp transistor and connected to the sense amplifiers,
  wherein the first interconnect layer is connected to gates of the first clamp transistors, and
  the second interconnect layer is connected to gates of the second clamp transistors.

4. The device of claim 1, further comprising an equalizing circuit connecting the first interconnect layer and the second interconnect layer in response to a control Signal.

5. The device of claim 4, wherein
  the equalizing circuit includes a MOS transistor connected between the first interconnect layer and the second interconnect layer, and
  the control signal is supplied to a gate of the MOS transistor.

6. The device of claim 4, further comprising sense amplifiers including the sense amplifier and provided to correspond to the memory cells,
  wherein the sense amplifiers are divided into a first group and a second group, and
  the equalizing circuit is arranged between the first group and the second group.

7. The device of claim 1, further comprising a third interconnect layer connecting the first interconnect layer and the second interconnect layer.

8. The device of claim 1, further comprising third interconnect layers connecting the first interconnect layer and the second interconnect layer.

9. The device of claim 7, further comprising sense amplifiers including the sense amplifier and provided to correspond to the memory cells,
  wherein the sense amplifiers are divided into a first group and a second group, and
  the third interconnect layer is arranged between the first group and the second group.

10. The device of claim 1, further comprising a bit line connecting the first clamp transistor and the memory cell.

11. The device of claim 1, wherein the fixed voltage is one of a power supply voltage and a ground voltage.

12. The device of claim 1, wherein
  a voltage of the first interconnect layer is different from a voltage of the second interconnect layer in a first operating mode, and
  the voltage of the first interconnect layer is equal to the voltage of the second interconnect layer in a second operating mode.

13. The device of claim 1, wherein the memory cell includes a variable resistive element.

14. The device of claim 1, wherein the memory cell includes a magnetoresistive element.

15. The device of claim 1, wherein the memory device is a spin-transfer torque magnetoresistive random access memory (STT-MRAM).

* * * * *